(12) United States Patent
Adachi

(10) Patent No.: US 8,319,428 B2
(45) Date of Patent: Nov. 27, 2012

(54) SEALING FILM FOR ORGANIC EL ELEMENT, ORGANIC EL ELEMENT, AND ORGANIC EL DISPLAY

(75) Inventor: Kazuya Adachi, Hino (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 12/999,537

(22) PCT Filed: Jun. 29, 2009

(86) PCT No.: PCT/JP2009/061862
§ 371 (c)(1),
(2), (4) Date: Jul. 6, 2011

(87) PCT Pub. No.: WO2011/001492
PCT Pub. Date: Jan. 6, 2011

(65) Prior Publication Data
US 2012/0104945 A1    May 3, 2012

(51) Int. Cl.
*H01L 51/50* (2006.01)
(52) U.S. Cl. ............ 313/512; 313/504; 257/98; 445/25; 428/690
(58) Field of Classification Search ............ 313/504, 313/512; 428/690; 257/98–100; 445/25
See application file for complete search history.

(56) References Cited

U.S. PATENT DOCUMENTS

| | | |
|---|---|---|
| 2001/0007412 A1 | 7/2001 | Eida et al. |
| 2005/0041193 A1 | 2/2005 | Lifka et al. |
| 2005/0194898 A1 * | 9/2005 | Kharrazi-Olsson et al. .. 313/512 |
| 2005/0248270 A1 * | 11/2005 | Ghosh et al. ............. 313/512 |
| 2007/0026243 A1 * | 2/2007 | Iwanaga et al. ............ 428/446 |
| 2008/0007163 A1 | 1/2008 | Matsuura et al. |
| 2008/0203908 A1 | 8/2008 | Hasegawa et al. |

FOREIGN PATENT DOCUMENTS

| | | |
|---|---|---|
| JP | 8-286033 A | 11/1996 |
| JP | 2005-512299 A | 4/2005 |
| JP | 2006-0164543 A | 6/2006 |
| JP | 2008-016699 A | 1/2008 |
| JP | 2008-210665 A | 9/2008 |

OTHER PUBLICATIONS

International Search Report issued in related PCT/JP2009/061862 mailed Sep. 15, 2009.

* cited by examiner

*Primary Examiner* — Nimeshkumar Patel
*Assistant Examiner* — Mary Ellen Bowman
(74) *Attorney, Agent, or Firm* — Rossi, Kimms & McDowell LLP

(57) ABSTRACT

An object of this invention is to provide a sealing film for an organic EL element having excellent moisture resistance, due to the absence of pinholes. A sealing film of this invention is a sealing film for an organic EL element having a layered structure of at least three layers with a silicon nitride film and a silicon oxynitride film layered in alternation, and is characterized in that odd-numbered layers from the side of the organic EL element are silicon nitride films having a film thickness (T1) of 200 nm or greater, and even-numbered layers from the side of the organic EL element are silicon oxynitride films having a film thickness (T2) of 20 nm or greater and 50 nm or less.

3 Claims, 4 Drawing Sheets

SEALING FILM FOR ORGANIC EL ELEMENT, ORGANIC EL ELEMENT, AND ORGANIC EL DISPLAY

CROSS-REFERENCE TO RELATED APPLICATIONS

This application is a National stage application of, and claims priority from, PCT Application No. PCT/JP2009/061862 filed on Jun. 29, 2009.

TECHNICAL FIELD

This invention mainly relates to a sealing film for an organic EL element. This invention further relates to an organic EL element comprising such a sealing film, and an organic EL display using such an organic EL element.

BACKGROUND ART

An organic EL display is generally formed by bonding together an organic EL element and a sealing substrate. In particular, a top-emission type organic EL display, which extracts light from the upper portion of an organic EL element, is formed by bonding to a substrate having red (R), green (G), and blue (B) color filters as a sealing substrate. A color conversion method is known as one means of obtaining an organic EL display capable of R, G, B multicolor light emission. A color conversion method is a method in which light emitted from an organic EL element is absorbed by a color conversion film arranged at the upper portion of the organic EL element, and light converted by the color conversion film passes through a color filter to reproduce a desired color.

An organic EL element generally has a structure in which are formed, in order on a substrate, a lower electrode, an organic EL layer, and an upper electrode. In order to form a plurality of emission portions which can be driven independently, each pixel of the lower electrode is insulated with a barrier wall, and active-matrix driving, connecting the lower electrodes of pixels with switching elements, can be performed. The organic EL layer includes at least an emission layer, and may include, as necessary, a hole injection layer, electron transport layer, and other layers.

An organic EL layer is extremely susceptible to oxygen and water, and when outside air or water intrudes into the panel interior and reaches the organic EL layer, growth of emission defect points called dark areas or dark spots occurs. Hence sealing films, comprising inorganic oxides, inorganic nitrides, or inorganic oxynitrides (SiO$_2$, SiON, SiN, and similar), are formed so as to cover the structure of the upper electrode and below. In formation of a sealing film, generally a plasma CVD film deposition method is used. In a plasma CVD film deposition method, a gas mixture of monosilane, disilane, ammonia, nitrous oxide, hydrogen, nitrogen, and similar is introduced into the vacuum chamber into which the substrate for film deposition has been placed, and by inducing plasma discharge, a silicon nitride (SiNx), silicon oxynitride (SiON), silicon oxide (SiOx), or other film is deposited on the substrate for film deposition.

When a sealing film is for example formed from a SiNx single layer, it is necessary to form the sealing film to a film thickness of several μm, in order to provide a function to adequately block outside air and water. Hence due to the film deposition lead time required, and the effect of longer plasma discharge time, the substrate temperature rises, and there are concerns that the organic EL layer may be damaged as a result.

Further, it is known that because SiNx has large residual stress, cracks appear if SiNx film is formed to a film thickness of several μm. Hence in Patent Reference 1, formation of a multilayer-structure sealing film is proposed in which SiNx and, as a stress relaxation layer, SiON are layered, so that the residual stress of the SiNx film is relaxed and crack occurrence is prevented (see Patent Reference 1). Here, it is stated that the SiON film used as a stress relaxation layer must have a film thickness of from 2 to 10 times that of the SiNx film. However, in Patent Reference 1, there is no disclosure of the effectiveness of the multilayer structure for suppressing pinholes, which are a factor detracting from the sealing performance.

Further, Patent Reference 2 discloses, as a sealing film for a display device, a layered structure including a first layer of SiNx and a second layer of SiOx, SiON, or similar (Patent Reference 2). Here, it is stated that a third layer of SiNx may further be provided. In Patent Reference 2, it is stated that the second layer of SiOx, SiON or similar is effective in sealing pinholes in the first layer of SiNx, but it is not recognized that as the film thickness of the second layer (SiON or similar) increases, pinholes increase and the sealing film characteristics are degraded.

Patent Reference 1: Japanese Patent Application Laid-open No. 2006-164543

Patent Reference 2: Japanese Translation of PCT Application No. 2005-512299

Among organic EL elements, active-matrix driven organic EL elements have switching elements comprising TFTs or similar and wiring for such elements, and pixels are surrounded by barrier walls to separate lower electrodes, so that the upper surface has a shape with numerous depressions and protrusions. An upper surface with numerous depressions and protrusions is one cause of the occurrence of pinholes in the sealing film formed thereupon. For example, in the case of a sealing film formed from a SiNx single-layer film, even when the film thickness is increased to several w, it is difficult to completely suppress pinholes which have appeared. Further, formation of such a sealing film with large thickness poses the problem of damage to organic EL elements due to plasma discharge in the CVD method.

DISCLOSURE OF THE INVENTION

The sealing film for an organic EL element of a first embodiment of the invention has a layered structure of at least three layers with a silicon nitride film and a silicon oxynitride film layered in alternation, and is characterized in that odd-numbered layers from the side of the organic EL element are silicon nitride films having a film thickness T1 of 200 nm or greater, even-numbered layers from the side of the organic EL element are silicon oxynitride films having a film thickness T2 of 20 nm or greater and 50 nm or less, and an uppermost layer is the silicon nitride film.

The organic EL element of a second embodiment of the invention includes, in order, a supporting substrate, a lower electrode, an organic EL layer, an upper electrode, and a sealing film, and is characterized in that the sealing film has a layered structure of at least three layers with a silicon nitride film and a silicon oxynitride film layered in alternation, a lowermost layer of the sealing film in contact with the upper electrode as well as odd-numbered layers from the lowermost layer are silicon nitride films having a film thickness T1 of 200 nm or greater, even-numbered layers from the lowermost layer of the sealing film are silicon oxynitride films having a film thickness T2 of 20 nm or greater and 50 nm or less, and an uppermost layer of the sealing film is a silicon nitride film.

The organic EL display of a third embodiment of the invention is characterized in including the organic EL element according to the second embodiment, and a color conversion layer.

A sealing film of this invention has excellent moisture resistance, due to the absence of pinholes. Further, an organic EL element of this invention can maintain excellent light emission efficiency over long periods of time through the use of sealing film having the above-described excellent moisture resistance. Further, a sealing film of this invention has high transmissivity for visible light, and so an organic EL element of this invention is useful as a top-emission type organic EL element in particular.

EXPLANATION OF REFERENCE NUMERALS

Figure 1:
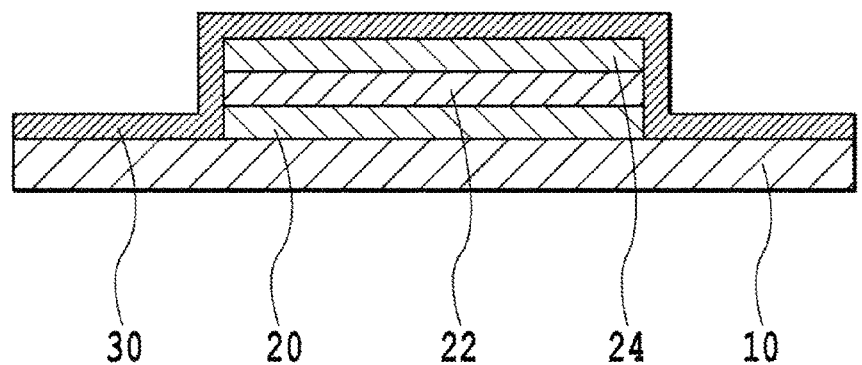
FIG. 1 is a cross-sectional view of one configuration example of an organic EL element of the invention.

| 10 | Supporting substrate |
| 20 | Lower electrode |
| 22 | Organic EL layer |
| 24 | Upper electrode |
| 30 | Sealing film |
| 40 | Sealing substrate |
| 42 | Color conversion layer |
| 50 | Adhesive layer |

BEST MODE FOR CARRYING OUT THE INVENTION

The sealing film for an organic EL element of a first embodiment of the invention has a layered structure of at least three layers with a silicon nitride film and a silicon oxynitride film layered in alternation, and is characterized in that odd-numbered layers from the side of the organic EL element are silicon nitride films having a film thickness T1 of 200 nm or greater, and even-numbered layers from the side of the organic EL element are silicon oxynitride films having a film thickness T2 of 20 nm or greater and 50 nm or less.

Pinholes which grow in the sealing film occur as a result of steps, protrusions, and similar in the organic EL element surface which is the base, and upon penetration from the organic EL element surface to the surface of the sealing film, become a path for passage of water and similar. The probability of penetration of a pinhole from the organic EL element surface to the sealing film surface is known to decrease with increasing film thickness. However, as explained above, it is difficult to completely suppress pinhole penetration, and moreover there are concerns that greater film thicknesses for the sealing film will cause damage to the organic EL element due to plasma discharge.

This inventor discovered that, as means of suppressing the growth of pinholes, it is effective to form a heterointerface by layering films of different materials. In this invention, "heterointerface" means an interface between two layers of different chemical types. An interface between two layers of the same chemical type (for example, two types of SiNx film) with the film deposition rate, discharge power, starting gas flow rate, gas pressure, or other film deposition conditions changed, cannot be expected to be effective in suppressing pinholes.

In a sealing film of this invention, odd-numbered layers from the side of the organic EL element are layers to impart to the sealing film a function for blocking oxygen and water. Odd-numbered layers include the layer in contact with the organic EL element (the first layer), which is an incident face of light emitted from the organic EL element. Hence in order to reduce optical losses when transmitting light emitted from the organic EL element, it is desirable that a material having a comparatively large refractive index be used in formation. For these reasons, odd-numbered layers are formed from silicon nitride (SiNx) films. Further, by making the film thickness T1 of the odd-numbered layers (and in particular the first layer) 200 nm or greater, it is possible to suppress the growth of pinholes occurring due to steps and protrusions in the surface on which the sealing film is formed.

In a sealing film of this invention, even-numbered layers from the side of the organic EL element are layers to form heterointerfaces with the odd-numbered layers and suppress growth of pinholes. Even-numbered layers are formed from silicon oxynitride (SiON) films. Because of the tendency for SiON to more readily absorb moisture compared with SiNx also, it is desirable that SiON be used in even-numbered layers. From the standpoint of suppressing pinhole growth, that is, prevention of formation of a path for passage of water, it is desirable that as many heterointerfaces as possible be formed within the range of a prescribed total film thickness, by setting the film thickness T2 of the even-numbered layers within the range of 20 nm or greater and 50 nm or less. Further, because SiON has a smaller refractive index than does SiNx, it is also advantageous for the film thickness T2 to be 20 nm or greater and 50 nm or less, which is thinner than the film thickness T1 of the odd-numbered layers, in order to reduce optical losses upon transmission of light emitted from the organic EL element.

The SiNx films and SiON films forming a sealing film of this invention are formed using a plasma CVD method. When forming a SiNx film, a mixture of monosilane, ammonia and an inert gas, and preferably a mixture of monosilane, ammonia and nitrogen, can be used as the starting gas. When forming a SiON film, a mixture of monosilane, ammonia, and nitrous oxide can be used as the starting gas.

During sealing film formation, in order to prevent a rise in temperature of the organic EL element, which serves as the substrate for film deposition, due to exposure to plasma, it is desirable that the temperature of the supporting substrate of the organic EL element be controlled to 70° C. or lower.

Further, by adopting the following method, a sealing film of this invention can be formed continuously without removing the substrate for film deposition from the film deposition chamber. After completion of formation of one layer, the plasma discharge and introduction of the starting gas are stopped, and residual starting gas in the film deposition chamber is evacuated. Next, introduction of the starting gas for formation of the next layer is begun, the starting gas pressure and flow rate are adjusted, and plasma discharge is started to form the next layer.

The organic EL element of a second embodiment of the invention includes, in order, a supporting substrate, lower electrode, organic EL layer, upper electrode, and sealing film, and is characterized in that the sealing film is the sealing film described in the first embodiment. FIG. 1 shows one example of an organic EL element of this invention. In the configuration of FIG. 1, the lower electrode 20, organic EL layer 22, and upper electrode 24 are formed in order on the supporting substrate 10, and the structure of the upper electrode 24 and below is covered by the sealing film 30.

The supporting substrate 10 is formed using material which can withstand various conditions (for example, the solvent used, temperature, and similar) employed when forming, layered thereupon in order, the lower electrode 20, organic EL layer 22, upper electrode 24, and sealing film 30. Further, it is preferable that the material of the supporting substrate 10 have excellent dimensional stability. Examples of preferable supporting substrates 10 include glass substrates, as well as rigid resin substrates formed from polyolephins, polymethyl methacrylate or other acrylic resins, polyethylene terephthalate or other polyester resins, polycarbonate resins, or polyimide resins. Further, flexible films formed from polyolephins, polymethyl methacrylate or other acrylic resins, polyethylene terephthalate or other polyester resins, polycarbonate resins, or polyimide resins or similar, can be used as supporting substrates 10.

Further, TFTs and other switching elements and wiring for same, and/or planarization film and similar, may be formed on the supporting substrate 10. A planarization film can be manufactured using an arbitrary resin. When forming a planarization film, a passivation film to prevent gas from the resin used to form the passivation film may be formed thereupon. A passivation film can be formed using a sputtering method, CVD method or similar, by depositing silicon oxide (SiOx), SiON, SiNx, or another inorganic material.

The lower electrode 20 and upper electrode 24 have functions for injecting charge into the organic EL layer 22, and are connected to an external driving circuit or to wiring to an external driving circuit. At least one among the lower electrode 20 and the upper electrode 24 is a transparent electrode. From the standpoint of light emission efficiency, it is desirable that the other among the lower electrode 20 and the upper electrode 24 by a reflective electrode. Desirable materials which can be used in formation of a reflective electrode include high-reflectivity metals (aluminum, silver, molybdenum, tungsten, nickel, chromium, and similar), or high-reflectivity amorphous alloys (NiP, NiB, CrP, CrB, and similar). From the standpoint of the possibility of obtaining a reflectivity of 80% or higher for visible light, particularly preferable materials include silver alloys. Silver alloys which can be used include for example alloys of silver with at least one type among group 10 nickel, group 1 rubidium, group 14 lead, and group 10 platinum, or alloys of silver with at least one type among group 2 magnesium and calcium.

On the other hand, desirable materials which can be used to form a transparent electrode include $SnO_2$, $In_2O_3$, In—Sn oxides, In—Zn oxides, ZnO, or Zn—Al oxides, or other conductive metal oxides.

In order that an electrode formed as a transparent electrode effectively function to extract light emitted from the organic EL layer 22 to the outside, it is desirable that the electrode have a transmissivity of 50% or higher, and preferably 85% or higher, for light of wavelengths 400 to 800 nm.

By dividing at least one of, or both of, the lower electrode 20 and the upper electrode 24 into a plurality of portions, an organic EL element having a plurality of emission portions which can be driven independently can be manufactured. For example, by dividing the lower electrode 20 into a plurality of partial electrodes, connecting each of the partial electrodes one-to-one to a switching element provided on the supporting substrate 10, and using the upper electrode 24 as an integrated common electrode, an active-matrix driving type organic EL element can be manufactured. Or, by dividing both the lower electrode 20 and the upper electrode 24 into a plurality of stripe-shape partial electrodes, such that the direction in which the stripe-shape partial electrodes of the lower electrode 20 extend intersects (and preferably intersects perpendicularly) with the direction in which the stripe-shape partial electrodes of the upper electrode 24 extend, a passive-matrix driving type organic EL element can be manufactured. In a passive-matrix driving type organic EL element, portions at which the stripe-shape partial electrodes of the lower electrode 20 intersect with the stripe-shape partial electrodes of the upper electrode 24 are emission portions.

The organic EL layer 22 is a layer, positioned between the lower electrode 20 and the upper electrode 24, which forms the core of the emission portion. The organic EL layer 22 includes at least an organic emission layer, and contains, as necessary, a hole transport layer, hole injection layer, electron transport layer, and/or electron injection layer. The organic layer 22 organic EL layer 22 can for example adopt layer configurations such as the following.

(1) Organic emission layer
(2) Hole injection layer/organic emission layer
(3) Organic emission layer/electron injection layer
(4) Hole injection layer/organic emission layer/electron injection layer
(5) Hole transport layer/organic emission layer/electron injection layer
(6) Hole injection layer/hole transport layer/organic emission layer/electron injection layer
(7) Hole injection layer/hole transport layer/organic emission layer/electron transport layer/electron injection layer In each of the above configurations (1) to (7), the electrode functioning as the anode is connected on the left side, and the electrode functioning as the cathode is connected on the right side.

A well-known material can be used to form the organic emission layer. As material to obtain emission in colors from blue to blue-green, for example fluorescent whitening agents such as benzothiazole system, benzoimidazole system, or benzoxazole system compounds; metal chelate oxonium compounds (aluminum complexes, of which $Alq_3$ (tris (8-quinolinato) aluminum complex) is representative, and similar); styryl benzene system compounds (4,4'-bis(diphenylvinyl) biphenyl (DPVBi) and similar); aromatic group dimethyldiene system compounds; fused aromatic ring compounds; ring assembly compounds; porphyrin system compounds; and similar, are preferable.

By adding a dopant to a host compound, an organic emission layer which emits light in various wavelength regions can be formed as well. In this case, as the host compound, a distyryl arylene system compound, N,N'-ditolyl-N,N'-diphenyl biphenylamine (TPD), $Alq_3$, or similar can be used. On the other hand, as the dopant, perylene (blue-purple), coumarin 6 (blue), quinacridone system compounds (blue-green to green), rubrene (yellow), 4-dicyanomethylene-2-(p-dimethyl amino styryl)-6-methyl-4H-pyran (DCM, red), platinum octaethylporphyrin complex (PtOEP, red), and similar can be used.

A hole transport layer can be formed using a material having a triarylamine partial structure, a carbazole partial structure, or an oxadiazole partial structure. Preferred materials for a hole transport layer include TPD, α-NPD, MTDAPB (o-, m-, p-), m-MTDATA, and similar.

A hole injection layer can be formed using Pcs (including CuPc and similar), an indanthrene system compound, and similar materials.

An electron transport layer can be formed using an aluminum complex such as $Alq_3$, oxadiazole derivatives such as PBD or TPOB, triazole derivatives such as TAZ, triazine derivatives, phenylquinoxalins, thiophene derivatives such as BMB-2T, and similar materials.

An electron injection layer can be formed using an aluminum complex such as $Alq_3$, or an aluminum quinolinol complex doped with an alkali metal or alkaline earth metal, or a similar material.

In addition to the above-described layers, a buffer layer (not shown) to raise the carrier injection efficiency can further be optionally formed between the organic EL layer 22 and the upper electrode 24. A buffer layer can be formed using a material with electron injection properties such as an alkali metal, an alkaline earth metal, an alloy of these, or a rare earth metal, or a fluoride of these metals, or similar. Further, in order to mitigate damage at the time of formation of the upper electrode 24, it is preferable that a damage mitigation layer (not shown), comprising MgAg or similar, be formed on the organic EL layer 22.

The sealing film 30 has the configuration described in the first embodiment, and is formed using the materials and methods described in the first embodiment.

Figure 2:
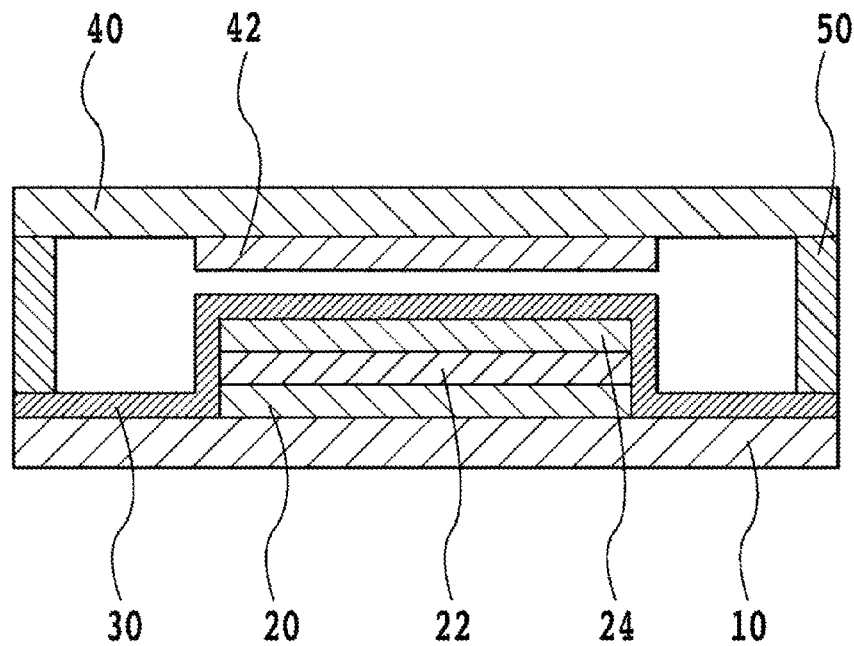
FIG. 2 is a cross-sectional view of one configuration example of an organic EL display of the invention.

The organic EL display of a third embodiment of the invention includes the organic EL element described in the second embodiment, and a color conversion layer. Here, the organic EL element has a plurality of emission portions which can be driven independently. FIG. 2 shows one configuration example of an organic EL display of the invention. The configuration of FIG. 2 is a structure in which a sealing substrate 40 including a color conversion layer 42 formed thereupon, and the organic EL element shown in FIG. 1, are bonded together by an adhesive layer 50. In the configuration of FIG. 2, the upper electrode 24 is a transparent electrode. Also, it is desirable that the lower electrode 20 be a reflective electrode.

The sealing substrate 40 can be formed using materials similar to those of the supporting substrate 10. When forming a structure on a single supporting substrate 10 which is to become a plurality of organic EL elements, the sealing substrate 40 may be a single substrate having dimensions equal to those of the supporting substrate 10, or may be a plurality of substrates having dimensions equivalent to the structures which are to become organic EL elements. When using a single sealing substrate 40 having dimensions equal to those of the supporting substrate 10, after bonding using the adhesive layer 50, cutting of the supporting substrate 10 and sealing substrate 40 is performed, and a plurality of organic EL elements are obtained. On the other hand, when using a plurality of sealing substrates 40 having dimensions equivalent to the structures which are to become organic EL elements, each of the sealing substrates 40 is arranged in a position corresponding to the structure which is to become the organic EL element, and bonding using the adhesive layer 50 is performed. After bonding, cutting of the supporting substrate 10 is performed, and a plurality of organic EL elements are obtained.

The color conversion layer 42 is a layer having functions to absorb light emitted by the organic EL layer 22, and to emit fluorescent light with a different wavelength distribution. An organic EL display of this embodiment may have a plurality of types of color conversion layers 42. Fluorescent materials which can be used to form color conversion layers 42 include low-molecular-weight organic fluorescent dyes such as $Alq_3$ and other aluminum chelate system dyes; 3-(2-benzothiazolyl)-7-diethylamino coumarin (coumarin 6), 3-(2-benzimidazolyl)-7-diethyl amino coumarin (coumarin 7), coumarin 135, and other coumarin system dyes; and Solvent Yellow 43, Solvent Yellow 44, and other naphthalimido system dyes; as well as high-polymer fluorescent materials, of which polyphenylenes, polyarylens, and polyfluorenes are representative. When necessary, color conversion layers 42 may be formed using mixtures of a plurality of types of fluorescent materials.

A color conversion layer 42 can be formed using an evaporation deposition method, application method, inkjet method, or other method. When using an inkjet method to form a patterned color conversion layer 42, the above-described fluorescent materials must be made into an ink. A solvent used in forming an ink is a solvent able to dissolve the fluorescent material. The solvent used depends on the type of fluorescent material used, but for example toluene or other nonpolar organic solvents, or chloroform, alcohol system materials, ketone system materials, or other polar organic solvents can be used. A mixture of a plurality of solvents can also be used, with the object of adjusting the ink viscosity and vapor pressure or the solubility of the fluorescent material.

Optionally, one type or a plurality of types of color filters (not shown) may be provided between the sealing substrate 40 and the color conversion layer 42. A color filter is a layer which passes light in a specific wavelength region, and adjusts the hue of light. A color filter can be formed using arbitrary materials and methods known in the art. When manufacturing a full-color organic EL display, it is desirable to provide, for example, red, green, and blue color filters.

Further, a black matrix (not shown) may optionally be provided in a gap between a plurality of types of color conversion layers 42, or in a gap between a plurality of types of color filters. A black matrix is a layer which blocks visible light and improves the contrast ratio of the organic EL display. A black matrix can be formed using arbitrary materials and methods known in the art. A black matrix may have a structure having a plurality of opening portions which delimit pixels or subpixels of the organic EL display, or may have a structure comprising a plurality of stripe-shape portions.

Further, a barrier layer (not shown) may optionally be provided so as to cover the color conversion layers 42. A barrier layer is a layer which prevents degradation of the color conversion layers 42 due to water or oxygen. A barrier layer can for example be formed using a sputtering method, CVD method or similar, by depositing $SiO_x$, SiON, $SiN_x$, or other inorganic materials.

The adhesive layer 50 is a layer which joins the supporting substrate 10 and the sealing substrate 40 at the peripheral portions of the substrates, and moreover isolates constituent layers of the organic EL layer 22 and similar from the external environment. The adhesive layer 50 can be formed using a UV-hardening adhesive or similar. With the object of controlling the interval between the supporting substrate 10 and the sealing substrate 40, the adhesive layer 50 may be formed using a UV-hardening adhesive which includes glass beads or other spacer particles.

Optionally, the internal space delimited by the supporting substrate 10, sealing substrate 40 and adhesive layer 50 may be filled with a light-transmitting resin.

FIG. 2 shows a an example of a so-called top-emission type configuration, in which a color conversion substrate in which a color conversion layer 42 is provided on a sealing substrate 40 is bonded with an organic EL element. However, a bottom-emission type configuration, in which the color conversion layer 42 is arranged between the supporting substrate 10 of the organic EL element and the lower electrode 20, may also be adopted. In this case, the lower electrode 20 is a transparent electrode. Further, it is desirable that the upper electrode 24 be a reflective electrode. Also, a barrier layer may be provided between the color conversion layer 42 and the lower electrode 20. Further, a color filter may be provided between the supporting substrate 10 and the color conversion layer 42. In addition, a black matrix (not shown) may be provided in a gap between a plurality of types of color conversion layers 42, or in a gap between a plurality of types of color filters.

EXAMPLES

Example 1

As a model of a substrate for film deposition, a Si wafer having 60 steps of height 1 μm per 1 cm² was prepared. With the temperature of the Si wafer controlled at 60° C., a first layer which was a SiNx film, a second layer which was a SiON film of film thickness 50 nm, and a third layer which was a SiNx film of film thickness 200 nm were formed, to obtain a sealing film with a three-layer structure. Here, the film thickness of the first layer was varied in the range 100 to 250 nm.

Next, a sample on which a sealing film was formed was immersed in a 20 weight percent potassium hydroxide aqueous solution at a liquid temperature of 75° C. for 2.5 hours. Then, the number of etch pits formed in the Si wafer were counted, and the etch pit density (number/cm²) was determined. This etch pit density is equivalent to the density of pinholes formed penetrating the sealing film. Evaluation results are shown in FIG. 3.

Figure 3:
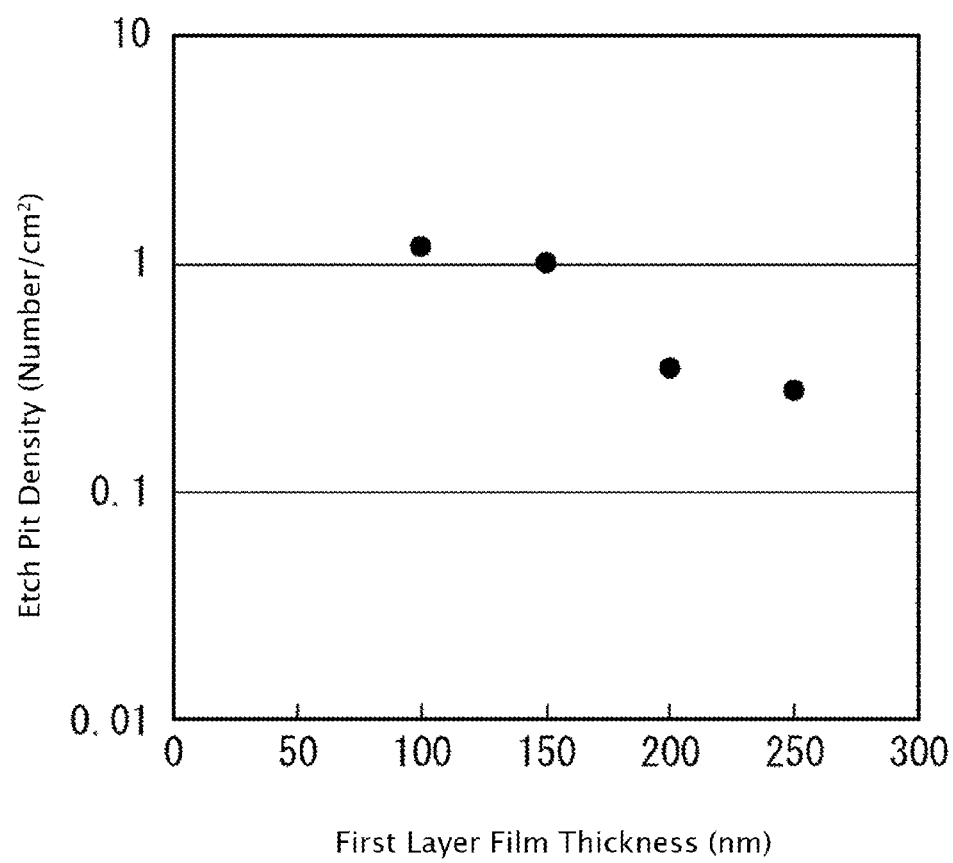
FIG. 3 is a graph showing evaluation results for the sealing film of Example 1.

As is clear from FIG. 3, by making the film thickness of the first layer 200 nm or greater, the etch pit density, that is, the density of pinholes, was reduced. This phenomenon is thought to have occurred because, when the film thickness of the first layer is less than 200 nm, there is an increase in the number of pinholes, arising from steps in the substrate for film deposition (Si wafer), growth of which cannot be suppressed even by the second-layer SiON film.

Example 2

Except for the facts that the film thickness of the first layer was fixed at 200 nm, and the film thickness of the second layer was varied between 0 nm and 100 nm, a procedure similar to that of Example 1 was used to manufacture and evaluate samples. Results appear in FIG. 4.

Figure 4:
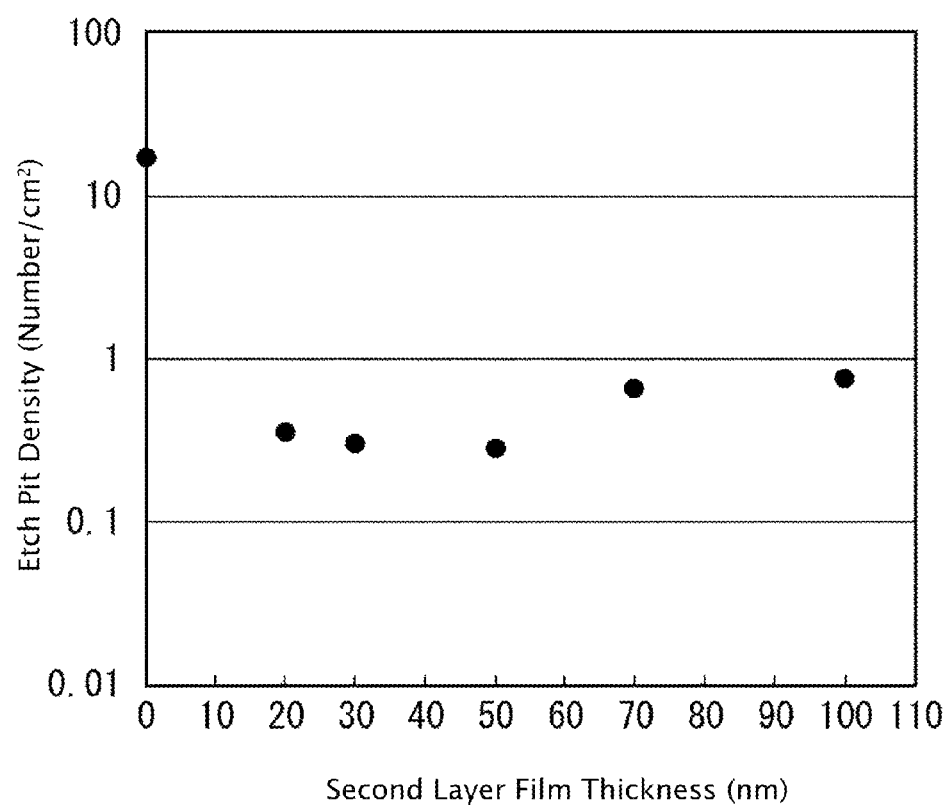
FIG. 4 is a graph showing evaluation results for the sealing film of Example 2.

As is clear from FIG. 4, when the film thickness of the second layer was 0 nm, that is, when a second layer was not formed and a heterointerface was not formed, the etch pit density increased markedly. From this it is seen that the existence of a heterointerface is important for suppression of the growth of pinholes. Further, when the film thickness of the second layer exceeded 50 nm, a tendency was observed for the etch pit density, that is, the pinhole density, to increase. This phenomenon is thought to be due to the fact that penetration of water is promoted when a prescribed film thickness is passed, due to the fact that SiON film has a higher moisture absorbance than does SiNx film.

Example 3

This example is used to verify the effects of the sealed film layered structure and total film thickness.

Samples in a first group had a sealing film comprising single-layer SiNx film. In samples in the first group, except for the facts that second layers and third layers were not formed, and that the film thickness of the first layer was varied between 200 and 600 nm, a procedure similar to that of Example 1 was used in formation.

Samples of a second group had a sealing film with a two-layer structure of an SiNx film/SiON film. Except for the facts that the samples of the second group did not have a third layer formed, that the film thicknesses of the first layer and the second layer were each ½ of the total film thickness, and that the total film thickness was varied between 200 and 600 nm, the procedure of Example 1 was used in formation.

Samples of a third group had a sealing film with a three-layer structure of an SiNx film/SiON film/SiNx film. Except for the facts that the samples of the third group had a first-layer film thickness which was ½ the total film thickness, that the second-layer film thickness was fixed at 50 nm, and that the total film thickness was varied between 200 and 600 nm, the procedure of Example 1 was used in formation.

The samples obtained for groups 1 to 3 were evaluated using a procedure similar to that for Example 1. Results appear in FIG. 5.

Figure 5:
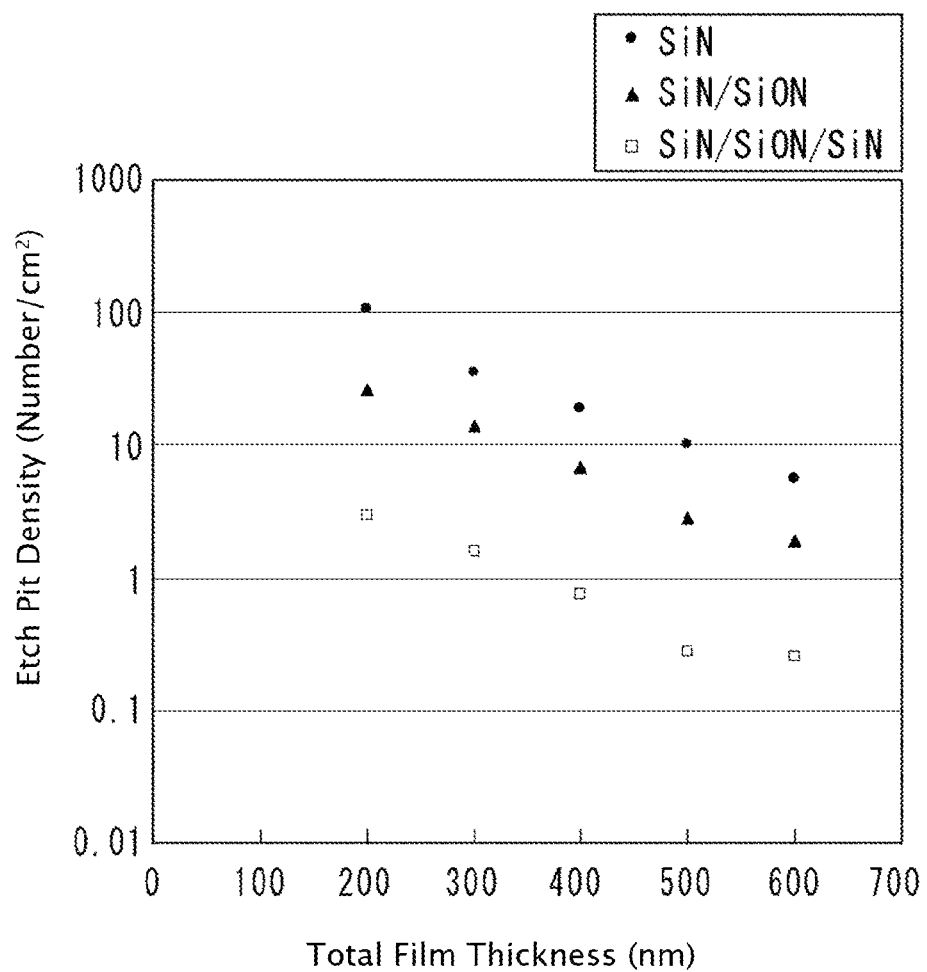
FIG. 5 is a graph showing evaluation results for the sealing film of Example 3.

As is clear from FIG. 5, compared with the single-layer structure samples of the first group and the two-layer structure samples of the second group, the samples of the third group with a three-layer structure exhibit lower etching densities. From this, it is seen that increasing the number of heterointerfaces formed by second-layer SiON films in a three-layer structure, as well as forming an SiNx film with low moisture absorbance as the third layer serving as the uppermost layer, are important for suppressing pinhole growth. Further, when the film thicknesses of the first and third layers are 200 nm or greater and the total film thickness is 500 nm or greater in particular, the etch pit density is reduced. It is thought that this is due to the effective suppressing of pinholes arising from steps in the substrate for film deposition due to the fact that the film thicknesses of the first and third layers are 200 nm or greater, as was proved in Example 1 as well.

Example 4

In this example, a red-emitting organic EL display with 2×2 pixels, with a pixel width of 0.3 mm×0.3 mm, is manufactured.

As the supporting substrate 10, fusion glass (1737 glass manufactured by Corning Inc., 50×50×1.1 mm) was prepared. A sputtering method was used to deposit Ag film, of film thickness 100 nm, onto the supporting substrate 10. The Ag film obtained was patterned using a photolithography method, and a lower electrode 20 comprising two stripe-shape electrodes, 0.3 mm in width, was formed.

Next, the supporting substrate 10 with lower electrode 20 formed was mounted in a resistive-heating evaporation deposition device. An evaporation deposition method employing a mask was used to form a buffer layer of Li, of film thickness 1.5 nm, on the lower electrode 20. Then, an evaporation deposition method was used to form an organic EL layer 22, comprising the four layers of an electron transport layer/emission layer/hole transport layer/hole injection layer. The electron transport layer was Alq$_3$ of film thickness 20 nm, the emission layer was DPVBi of film thickness 30 nm, the hole transport layer was α-NPD of film thickness 10 nm, and the hole injection layer was CuPc of film thickness 100 nm. At the time of deposition of the organic EL layer 22, the pressure within the vacuum chamber of the device was made 1×10$^{-4}$ Pa, and each layer was formed at a deposition rate of 0.1 nm/s.

Then, an evaporation deposition method was used to form an MgAg film of film thickness 5 nm, and a damage mitigation layer was formed.

Next, the layered member with damage mitigation layer formed was moved into a facing sputtering device without breaking the vacuum. A sputtering method using a metal mask was employed to deposit IZO to a film thickness of 100 nm, and a transparent upper electrode 24 was formed. The upper electrode 24 was formed from two stripe-shape electrodes, extending in the direction perpendicular to the stripe-shape electrodes of the lower electrode 20, and having a width of 0.3 mm.

Next, the layered member with upper electrode 24 formed was moved into a plasma CVD device. A plasma CVD method was used to form a seven-layer sealing film 30 with total film thickness of 1000 nm, and an organic EL element was obtained. The first layer in contact with the upper electrode 24 was a SiNx film of film thickness 250 nm. The second, fourth and sixth layers were SiON films of film thickness 50 nm, and the third, fifth and seventh layers were SiNx films of film thickness 200 nm.

In forming each of the SiNx films, a mixture of monosilane at a flow rate of 70 sccm, ammonia at a flow rate of 80 sccm, and nitrogen at a flow rate of 2000 sccm, was used as the starting gas. The pressure within the film deposition chamber was set to 100 Pa, and high-frequency power at a frequency of 27.12 MHz and power density of 0.5 W/cm$^2$ was applied, and SiNx film was deposited. At this time, the temperature of the stage holding the substrate for film deposition was set to 60° C.

In forming each of the SiON films, a mixture of monosilane at a flow rate of 70 sccm, ammonia at a flow rate of 80 sccm, nitrous oxide at a flow rate of 20 sccm, and nitrogen at a flow rate of 2000 sccm, was used as the starting gas. The pressure within the film deposition chamber was set to 100 Pa, and high-frequency power at a frequency of 27.12 MHz and power density of 0.5 W/cm$^2$ was applied, and SiON film was deposited. At this time, the temperature of the stage holding the substrate for film deposition was set to 60° C.

Switching between formation of each of the constituent layers was performed by a procedure in which the high-frequency power and starting gas introduction were stopped, the starting gas remaining in the film deposition chamber was evacuated, introduction of the starting gas for the next layer was begun, the pressure in the film deposition chamber was adjusted, and application of high-frequency power was resumed.

Separately, fusion glass (1737 glass manufactured by Corning Inc., 50×50×1.1 mm) was prepared as the sealing substrate 40. A red color filter material (Color Mosaic CR7001, available from Fujifilm Corp.) was applied onto the sealing substrate 40, and patterning was performed, and a red color filter comprising four portions having dimensions 0.5 mm×0.5 mm, at positions equivalent to pixels of the organic EL element, was formed. The red color filter had a film thickness of 1.5 μm.

Next, the sealing substrate 40 with red color filter formed was mounted in a resistive-heating evaporation deposition device. Using an evaporation deposition method, a red color conversion layer 42 containing coumarin 6 and DCM-2, and having a film thickness of 300 nm, was deposited on the red color filter. The coumarin 6 and DCM-2 were each heated in separate crucibles, and the rate of evaporation deposition of the coumarin 6 was made 0.3 nm/s, while the rate of evaporation deposition of the DCM-2 was made 0.005 nm/s. The molar ratio of coumarin 6:DCM-2 in the color conversion layer 42 was 49:1.

The layered member in which are layered the organic EL element and color conversion layer 42 was transported to a bonding device, held in an environment with oxygen and water contents of 5 ppm or less each. Next, a dispenser was used to apply an epoxy system UV-hardening adhesive to the peripheral portion of the sealing substrate 40. Next, with the color conversion layer 42 and the sealing film 30 opposed, adhesive was used to bond together the sealing substrate 40 and the supporting substrate 10. Next, a mask was used to irradiate only the UV-hardening adhesive on the peripheral portion of the sealing substrate 40 with ultraviolet rays, and the adhesive was temporarily hardened. Next, the bonded member was heated in a heating furnace for one hour at 80° C., to harden the adhesive and form an adhesive layer 50, and an organic EL display was obtained.

Comparative Example 1

Except for the fact that the sealing film 30 was formed using only a SiNx film of film thickness 1000 nm, the procedure of Example 4 was repeated, and an organic EL display was obtained. Formation of the SiNx film was performed using conditions similar to those of Example 4.

Comparative Example 2

Except for the fact that the sealing film 30 had a five-layer configuration with a total film thickness 1000 nm, the procedure of Example 4 was repeated, and an organic EL display was obtained. The first, third and fifth layers of the sealing film 30 were SiNx films of film thickness 200 nm, and the second and fourth layers were SiON films of film thickness 200 nm. Formation of the SiNx films and SiON films was performed using conditions similar to those of Example 4.

(Evaluation)

Organic EL displays of Example 4 and of Comparative Examples 1 and 2 were continuously driven for 1000 hours at a current density of 0.1 A/cm$^2$ in a 60° C., 90% RH environment. Then, the number of occurrences of dark spots of diameter 50 μm or greater was counted. Evaluations of 10 samples of the displays of each example were performed, and the density of occurrence of dark spots per 1 cm$^2$ was calculated. Results appear in Table 1.

TABLE 1

Density of occurrence of dark spots in organic EL displays

|  | Density of occurrence of dark spots (number/cm$^2$) |
| --- | --- |
| Example 4 | 0.3 |
| Comparative Example 1 | 10 |
| Comparative Example 2 | 5 |

As is clear from Table 1, compared with the displays of Comparative Example 1, using single-layer sealing films, the occurrence of dark spots was suppressed in the displays of Example 4 and Comparative Example 2, which used multi-layer sealing films. However, in the display of Comparative Example 2, because the film thickness of the SiON films with high moisture absorbance was large, the effect in suppressing dark spots was not adequate. On the other hand, it was found that in the displays of Example 4, which used SiON films having a smaller film thickness and which functioned mainly to form heterointerfaces, dark spots could be adequately suppressed.

The invention claimed is:

1. A sealing film for an organic EL element, having a layered structure of at least three layers with a silicon nitride film and a silicon oxynitride film layered in alternation, characterized in that
   odd-numbered layers from the side of the organic EL element are silicon nitride films having a film thickness $T1$ of 200 nm or greater,
   even-numbered layers from the side of the organic EL element are silicon oxynitride films having a film thickness $T2$ of 20 nm or greater and 50 nm or less, and
   an uppermost layer is the silicon nitride film.

2. An organic EL element comprising, in order, a supporting substrate, a lower electrode, an organic EL layer, an upper electrode, and a sealing film, characterized in that
   the sealing film has a layered structure of at least three layers with a silicon nitride film and a silicon oxynitride film layered in alternation,
   a lowermost layer of the sealing film in contact with the upper electrode as well as odd-numbered layers from the lowermost layer are silicon nitride films having a film thickness $T1$ of 200 nm or greater,
   even-numbered layers from the lowermost layer of the sealing film are silicon oxynitride films having a film thickness $T2$ of 20 nm or greater and 50 nm or less, and
   an uppermost layer of the sealing film is a silicon nitride film.

3. An organic EL display, comprising the organic EL element according to claim 2, and a color conversion layer.

* * * * *